(12) United States Patent
Chang et al.

(10) Patent No.: US 11,495,533 B2
(45) Date of Patent: Nov. 8, 2022

(54) SEMICONDUCTOR DEVICE AND METHOD OF FABRICATING THE SAME

(71) Applicant: Samsung Electronics Co., Ltd., Suwon-si (KR)

(72) Inventors: Jihoon Chang, Yongin-si (KR); Jimin Choi, Seoul (KR); Yeonjin Lee, Suwon-si (KR); Hyeon-Woo Jang, Suwon-si (KR); Jung-Hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 112 days.

(21) Appl. No.: 17/153,963

(22) Filed: Jan. 21, 2021

(65) Prior Publication Data
US 2021/0305153 A1 Sep. 30, 2021

(30) Foreign Application Priority Data

Mar. 27, 2020 (KR) .................. 10-2020-0037771
Jul. 30, 2020 (KR) .................. 10-2020-0095459

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76828* (2013.01);
(Continued)

(58) Field of Classification Search
CPC .......... H01L 23/5226; H01L 21/76802; H01L 21/76828; H01L 21/76832; H01L 21/76834; H01L 21/76843; H01L 21/76877; H01L 23/53214; H01L 23/53228; H01L 23/53266; H01L 23/53223; H01L 24/00; H01L 2221/1078; H01L 21/7685; H01L 21/76885;
(Continued)

(56) References Cited

U.S. PATENT DOCUMENTS 6,794,755 B2   9/2004  Maiz et al.
7,858,510 B1  12/2010  Banerji et al.
(Continued)

FOREIGN PATENT DOCUMENTS

CN   101996935 A   3/2011
JP   2000-077521 A  3/2000
(Continued)

*Primary Examiner* — Karen Kusumakar
(74) *Attorney, Agent, or Firm* — Harness, Dickey & Pierce, P.L.C.

(57) ABSTRACT

The method includes forming a first dielectric layer on a substrate, forming a via in the first dielectric layer, sequentially forming a first metal pattern, a first metal oxide pattern, a second metal pattern, and an antireflective pattern on the first dielectric layer, and performing an annealing process to react the first metal oxide pattern and the second metal pattern with each other to form a second metal oxide pattern. The forming the second metal oxide pattern includes forming the second metal oxide pattern by a reaction between a metal element of the second metal pattern and an oxygen element of the first metal oxide pattern.

20 Claims, 8 Drawing Sheets

(52) U.S. Cl.
CPC .. *H01L 21/76832* (2013.01); *H01L 21/76834* (2013.01); *H01L 21/76843* (2013.01); *H01L 21/76877* (2013.01); *H01L 23/53214* (2013.01); *H01L 23/53228* (2013.01); *H01L 23/53266* (2013.01)

(58) Field of Classification Search
CPC ....... H01L 21/823475; H01L 21/76838; H01L 23/5386; H01L 27/088
See application file for complete search history.

(56) References Cited

U.S. PATENT DOCUMENTS

2018/0366330 A1* 12/2018 Hegde ............... H01L 21/02244
2019/0115529 A1*  4/2019 Liu .................... H01L 45/1233

FOREIGN PATENT DOCUMENTS

| | | |
|---|---|---|
| JP | 2001-176816 A | 6/2001 |
| JP | 2008-300866 A | 12/2008 |
| KR | 1998-0005417 A | 3/1998 |
| KR | 2000-0056260 A | 9/2000 |
| KR | 10-0327595 B1 | 3/2002 |
| KR | 10-2005-0010259 A | 1/2005 |
| KR | 10-0802252 B1 | 2/2008 |

* cited by examiner

SEMICONDUCTOR DEVICE AND METHOD OF FABRICATING THE SAME

CROSS-REFERENCE TO RELATED APPLICATIONS

This U.S. nonprovisional application claims priority under 35 U.S.C § 119 to Korean Patent Application Nos. 10-2020-0037771 filed on Mar. 27, 2020 and 10-2020-0095459 filed on Jul. 30, 2020 the Korean Intellectual Property Office, the disclosures of each of which are hereby incorporated by reference in their entirety.

BACKGROUND

Some example embodiments relate to a semiconductor device and/or a method of fabricating the same.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and/or hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and are integrated to meet these requested characteristics.

SUMMARY

Some example embodiments of inventive concepts provide a semiconductor device whose electrical characteristics are improved.

Some example embodiments of inventive concepts provide a method of fabricating a semiconductor device whose electrical characteristics are improved.

According to some example embodiments a method of fabricating a semiconductor device may comprise forming a first dielectric layer on a substrate, forming a via in the first dielectric layer, sequentially forming a first metal pattern, a first metal oxide pattern, a second metal pattern, and an antireflective pattern on the first dielectric layer, and performing an annealing process to react the first metal oxide pattern and the second metal pattern with each other to form a second metal oxide pattern. The forming the second metal oxide pattern includes forming the second metal oxide pattern by a reaction between a metal element of the second metal pattern and an oxygen element of the first metal oxide pattern.

According to some example embodiments, a semiconductor device may comprise a substrate, a first metal pattern on the substrate, a second metal pattern on the first metal pattern, a via between the first metal pattern and the second metal pattern, a metal oxide pattern on the second metal pattern, and an antireflective pattern on the metal oxide pattern. The second metal pattern includes aluminum (Al), the metal oxide pattern includes titanium oxide, the antireflective pattern includes titanium nitride, the via includes a metallic material different from a metallic material of the second metal pattern, and the first metal pattern includes a metallic material different from the metallic material of the second metal pattern and the metallic material of the via.

According to some example embodiments, a semiconductor device may comprise a substrate, a first dielectric layer on the substrate, a metal pattern on the first dielectric layer, a metal oxide pattern on the metal pattern, an antireflective pattern on the metal oxide pattern, a second dielectric layer on the first dielectric layer, the second dielectric layer covering the metal pattern, the metal oxide pattern, and the antireflective pattern, a first via that penetrates the first dielectric layer and is connected to the metal pattern, and a second via that penetrates a portion of the second dielectric layer and is connected to the metal pattern. The metal pattern includes aluminum (Al), the metal oxide pattern includes titanium oxide, the antireflective pattern includes titanium nitride, and the first via and the second via include a material different from a material of the metal pattern.

DETAILED DESCRIPTION OF EXAMPLE EMBODIMENTS

Some example embodiments of inventive concepts will now be described in detail with reference to the accompanying drawings to aid in clearly explaining the present inventive concepts.

Figure 1:
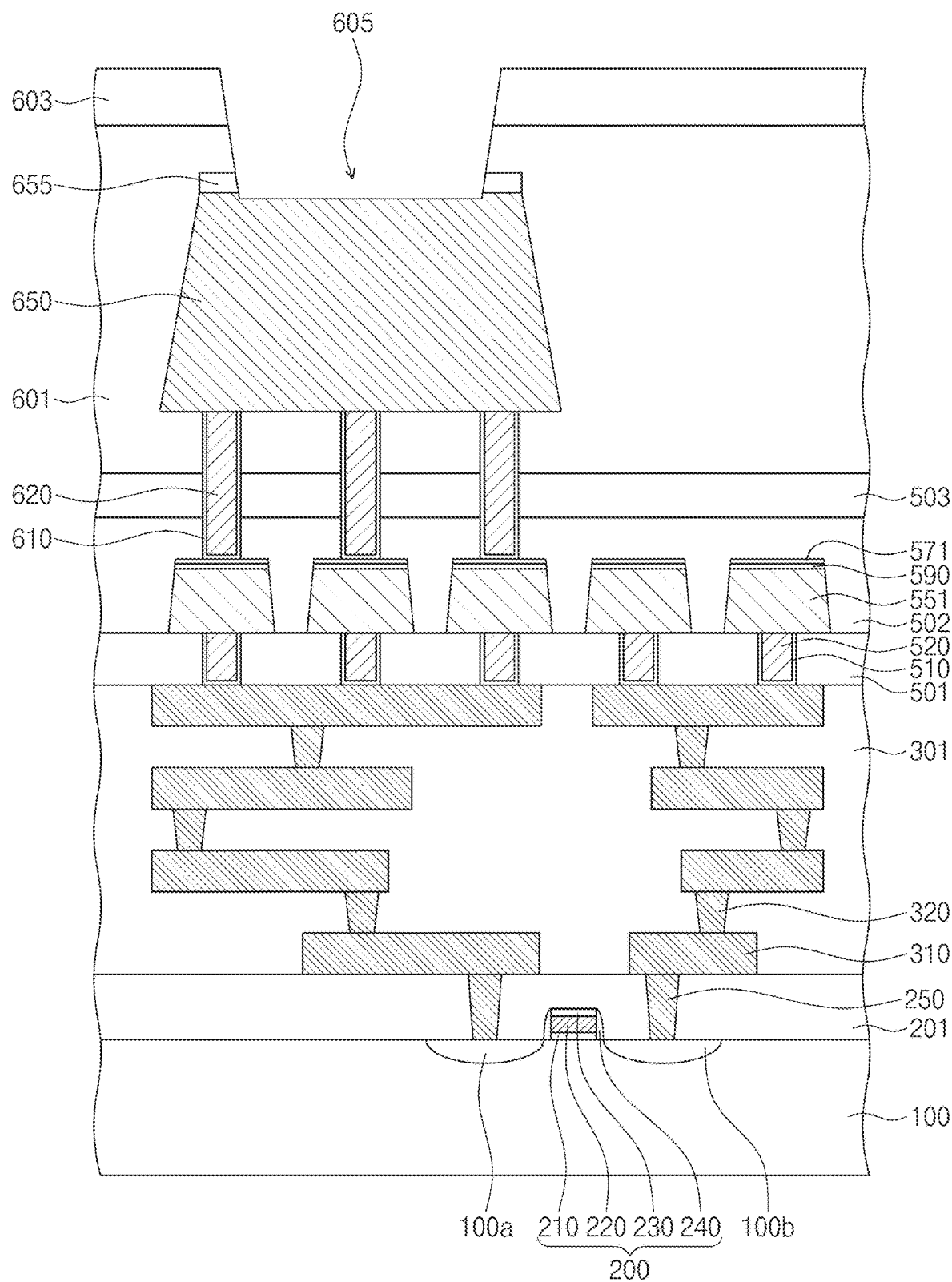
FIG. 1 illustrates a simplified cross-sectional view showing a semiconductor device according to some example embodiments of inventive concepts.

FIG. 1 illustrates a simplified cross-sectional view showing a semiconductor device according to some example embodiments of inventive concepts.

Referring to FIG. 1, a semiconductor device according to some example embodiments of inventive concepts may include a substrate 100, a lower dielectric layer 201, a first dielectric layer 301, a first metal pattern 310, a second dielectric layer 501, a first via 520, a third dielectric layer 502, a second metal pattern 551, a metal oxide pattern 590, an antireflective pattern 571, a second via 620, a first passivation layer 503, an upper dielectric layer 601, and a second passivation layer 603.

The substrate 100 may be or include a semiconductor substrate, such as a silicon substrate, a germanium substrate, a silicon-germanium substrate, and/or a silicon-on-insulator (SOI) substrate. A transistor 200 may be formed on or on and within the substrate 100. The transistor 200 may include a gate dielectric pattern 210, a gate electrode 220, and a gate capping pattern 230 that are sequentially stacked. The transistor 200 may further include a gate spacer 240 on opposite sidewalls of each of the gate dielectric pattern 210, the gate electrode 220, and the gate capping pattern 230. The transistor 200 may be provided on its opposite sides with impurity regions 100a and 100b serving as source/drain regions. The transistor 200 may be formed in plural on the substrate 100. The transistor 200 may be an N-type transistor, or P-type transistor.

The gate dielectric pattern 210 may include at least one of oxide, nitride, oxynitride, or metal silicate. The gate electrode 220 may include a conductive material, such as tungsten (W), molybdenum (Mo), tantalum (Ta), titanium nitride (TiN), tungsten nitride (WN), and/or tantalum nitride (TaN). The gate capping pattern 230 may include silicon oxide and/or silicon nitride. The gate spacer 240 may include silicon oxide and/or silicon nitride.

The substrate 100 may be provided thereon with the lower dielectric layer 201 that covers the transistor 200. The substrate 100 may be provided thereon with a lower contact 250 that penetrates the lower dielectric layer 201 and is connected to the substrate 100. The lower dielectric layer 201 may include silicon oxide, for example, at least one of tetraethylorthosilicate (TEOS), phosphosilicate glass (PSG), and undoped silicate glass (USG). The lower contact 250 may include a conductive material, such as copper (Cu).

A plurality of first metal patterns 310 may be disposed on the lower dielectric layer 201. A lowermost one of the first metal patterns 310 may be connected to the lower contact 250. The first metal patterns 310 may be disposed spaced apart from each other in a direction perpendicular to a top surface of the substrate 100. A plurality of upper contacts 320 may be disposed alternately with the first metal patterns 310. The first metal patterns 310 may be electrically connected to each other through the upper contacts 320. The first metal patterns 310 and the upper contacts 320 may include a conductive material, such as copper (Cu). A number of layers of first metal patterns 310 may be an integer such as one, two, three, four, five, six, seven, eight, nine, ten, or more than ten. Further a number of layers of upper contacts 320 may be an integer such as one, two, three, four, five, six, seven, eight, nine, ten, or more than ten. A number of layers of the upper contacts 320 may be one less than a number of layers of first metal patterns 310; however, example embodiments are not limited thereto. The first metal patterns 310 and the upper contacts 320 may be formed with a via-first process or a via-last process; however, example embodiments are not limited thereto.

The lower dielectric layer 201 may be provided thereon with the first dielectric layer 301 that covers the first metal patterns 310 and the upper contacts 320. The first dielectric layer 301 may include silicon oxide as inter-metal dielectric (IMD), for example, at least one of tetraethylorthosilicate (TEOS), phosphosilicate glass (PSG), and undoped silicate glass (USG).

The second dielectric layer 501 may be disposed on and may cover the first dielectric layer 301 and an uppermost one of the first metal patterns 310. The second dielectric layer 501 may include silicon oxide as inter-metal dielectric (IMD), for example, at least one of tetraethylorthosilicate (TEOS), phosphosilicate glass (PSG), and undoped silicate glass (USG).

The uppermost first metal pattern 310 may be provided thereon with a plurality of first vias 520 that penetrate the second dielectric layer 501 and are electrically connected to the uppermost first metal pattern 310. A first barrier layer 510 may be disposed to intervene between the second dielectric layer 501 and a lateral surface of the first via 520 and to extend between the uppermost first metal pattern 310 and a bottom surface of the first via 520. The first barrier layer 510 may be formed to have a uniform thickness. The first via 520 may include a different material from that of the first metal patterns 310. For example, all materials, or at least one material, included in the first via 520 may be different from any of the materials included in the first metal patterns 310. The first via 520 may include a conductive material, such as tungsten (W). The first barrier layer 510 may include a conductive material or conductive metal nitride. For example, the first barrier layer 510 may include tungsten nitride (WN) or tungsten carbonitride (WCN).

A plurality of second metal patterns 551 may be disposed on the second dielectric layer 501. The second metal patterns 551 may be electrically connected to the first vias 520. The second metal pattern 551 may include a different material from that of the first metal patterns 310. For example, all materials, or at least one material, included in the second metal pattern 551 may be different from any of the materials included in the first metal pattern 310. The second metal pattern 551 may include a different material from that of the first via 520. The second metal pattern 551 may include a conductive material, such as aluminum (Al). The metal oxide pattern 590 and the antireflective pattern 571 may be sequentially formed on the second metal pattern 551. The metal oxide pattern 590 may include conductive metal oxide, such as titanium oxide (TiO2). The antireflective pattern 571 may include the same metal element as that of the metal oxide pattern 590. The antireflective pattern 571 may include a different material from that of the first barrier layer 510. For example, all materials, or at least one material, included in the antireflective pattern 571 may be different from any of the materials included in the first barrier layer 510. The antireflective pattern 571 may include conductive metal nitride, such as titanium nitride (TiN). The metal oxide pattern 590 may be in contact with/direct contact with a top surface of the second metal pattern 551, and the antireflective pattern 571 may be in contact with/direct contact with a top surface of the metal oxide pattern 590. As the metal oxide pattern 590 is formed on the second metal pattern 551, nitrogen (N) may be prevented, or reduced in likelihood, from diffusing into the second metal pattern 551, and thus the second metal pattern 551 may have no or minimum or reduced concentration of nitrogen (N). The presence of the metal oxide pattern 590 may reduce resistance of semiconductor devices and may reduce, e.g., minimize thermal stress generated from an annealing process. Alternatively or additionally, the metal oxide pattern 590 may promote diffusion of hydrogen into a semiconductor substrate, and thus transistors may reduce their leakage current and in particular volatile and/or non-volatile semiconductor devices may improve in refresh characteristics, with the result that the semiconductor device may be provided with improved electrical characteristics.

The third dielectric layer 502 may be disposed on the second dielectric layer 501. The third dielectric layer 502 may cover a lateral surface of the second metal pattern 551, a lateral surface of the metal oxide pattern 590, and lateral and top surfaces of the antireflective pattern 571. The third dielectric layer 502 may include silicon oxide as inter-metal dielectric (IMD), for example, at least one of tetraethylorthosilicate (TEOS), phosphosilicate glass (PSG), and undoped silicate glass (USG).

The first passivation layer 503 may be disposed on the third dielectric layer 502. The first passivation layer 503 may cover the third dielectric layer 502. The first passivation layer 503 may be formed to have a uniform thickness on the third dielectric layer 502. The first passivation layer 503 may include a different material from that of the second dielectric layer 501 and that of the third dielectric layer 502. For example, there may not be a common material among any of the first passivation layer 503, the second dielectric layer 501, or the third dielectric layer 502. The first passivation layer 503 may include one or more of silicon nitride, silicon carbonitride, silicon oxynitride, and silicon oxycarbonitride. The first passivation layer 503 may include, for example, one or more of SiN, SiCN, SiON, and SiOCN.

An upper pad 650 may be disposed on the first passivation layer 503. A protective layer 655 may be disposed on the upper pad 650. The upper pad 650 may include a conductive material, such as at least one of aluminum (Al), copper (Cu), tungsten (W), or nickel (Ni). The protective layer 655 may include a conductive material, conductive nitride, conductive carbide, and/or conductive carbonitride. For example, the protective layer 655 may include one or more of Ti, Ta, TaN, TiN, TiSiN, W, WN, WC, and WCN.

The upper dielectric layer 601 may be disposed on the first passivation layer 503. The upper dielectric layer 601 may cover the upper pad 650 and the protective layer 655. The second passivation layer 603 may be disposed on the upper dielectric layer 601. The second passivation layer 603 may cover the upper dielectric layer 601. The second passivation layer 603 may be formed to have a uniform thickness on the upper dielectric layer 601. The upper dielectric layer 601 may include silicon oxide as inter-metal dielectric (IMD), for example, at least one of tetraethylorthosilicate (TEOS), phosphosilicate glass (PSG), and undoped silicate glass (USG). The second passivation layer 603 may include one or more of silicon nitride, silicon carbonitride, silicon oxynitride, and silicon oxycarbonitride. For example, the second passivation layer 603 may include one or more of SiN, SiCN, SiON, and SiOCN.

Some of a plurality of antireflective patterns 571 may be provided thereon with a plurality of second vias 620 that penetrate a portion of the third dielectric layer 502, the first passivation layer 503, and a portion of the upper dielectric layer 601. The second via 620 may electrically connect the upper pad 650 to the second metal pattern 551. A second barrier layer 610 may be disposed to intervene between a lateral surface of the second via 620, the portion of the third dielectric layer 502, the first passivation layer 503, and the portion of the upper dielectric layer 601, while extending between the antireflective pattern 571 and a bottom surface of the second via 620. The second via 620 may include a different material from that of the second metal pattern 551. There may not be a common material between the second via 620 and the second metal pattern 551. The second via 620 may include a conductive material, such as tungsten (W).

The second barrier layer 610 may include a different material from that of the first barrier layer 510. For example, the second barrier layer 610 may not include any material included in that of the first barrier layer 510. The second barrier layer 610 may include the same material as that of the antireflective pattern 571. For example, the second barrier layer 610 may be the same material as that of the antireflective pattern 571. The second barrier layer 610 may include a conductive material or conductive metal nitride. For example, the second barrier layer 610 may include titanium nitride (TiN).

The upper pad 650, the protective layer 655, the upper dielectric layer 601, and the second passivation layer 603 may be partially removed to form a first recession 605 to which a portion of the upper pad 650 is exposed.

According to some example embodiments inventive concepts, differently from that shown in FIG. 1, the upper pad 650 may not be included. For example, a redistribution line may be disposed instead.

Figure 2:
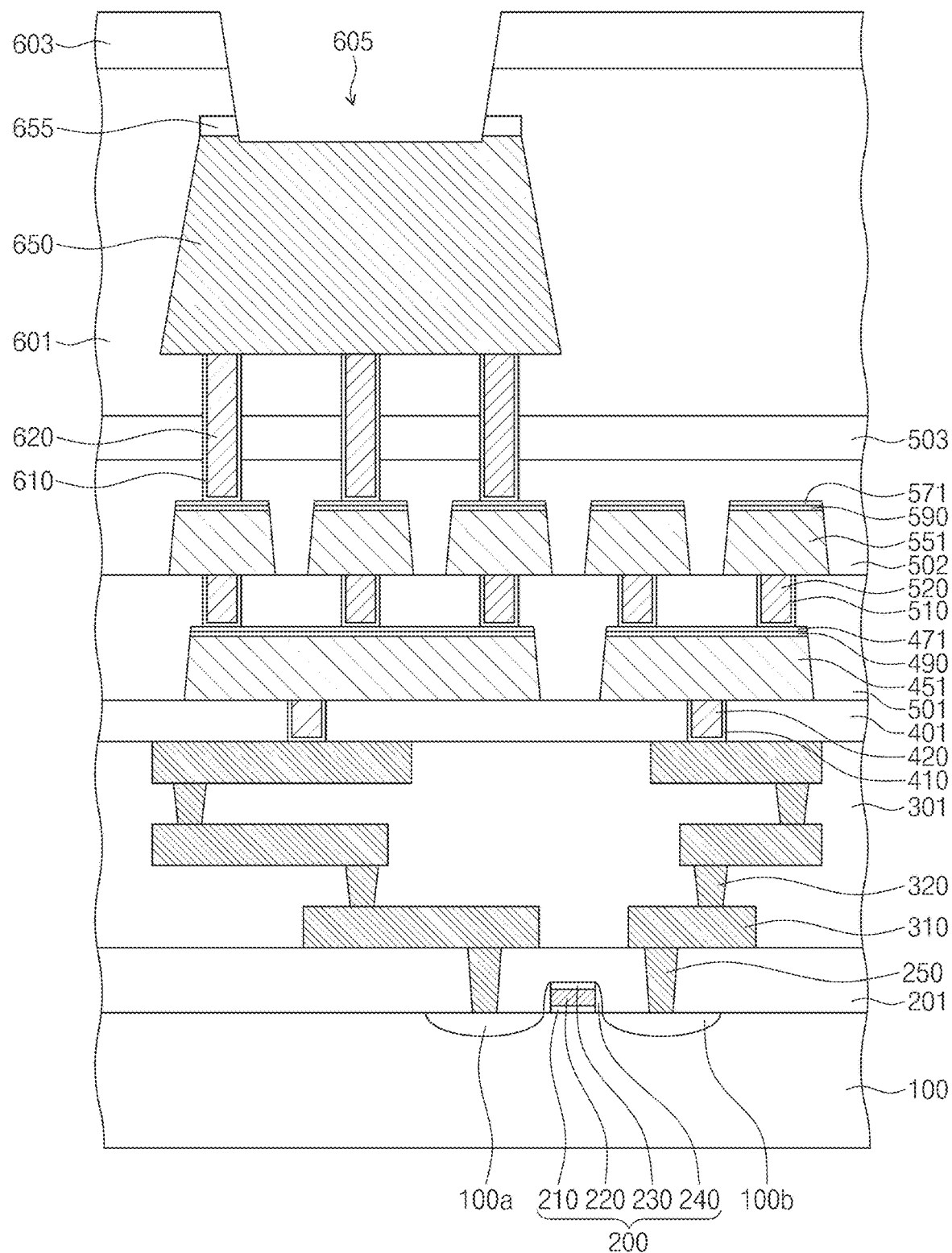
FIG. 2 illustrates a simplified cross-sectional view showing a semiconductor device according to some example embodiments of inventive concepts.

FIG. 2 illustrates a simplified cross-sectional view showing a semiconductor device according to some example embodiments of inventive concepts. For brevity of description, differences from the semiconductor device discussed with reference to FIG. 1 will be mainly explained below.

Referring to FIG. 2, an intermediate dielectric layer 401 may be interposed between the first dielectric layer 301 and the second dielectric layer 501. The uppermost first metal pattern 310 may be provided thereon with a plurality of intermediate vias 420 that penetrate the intermediate dielectric layer 401. The intermediate vias 420 may be electrically connected to the first metal patterns 310. An intermediate barrier layer 410 may be disposed to intervene between the intermediate dielectric layer 401 and a lateral surface of the intermediate via 420 and to extend between the uppermost first metal pattern 310 and a bottom surface of the intermediate via 420. The intermediate barrier layer 410 may be formed to have a uniform thickness in the intermediate dielectric layer 401. The intermediate via 420 may include a conductive material, such as tungsten (W). The intermediate barrier layer 410 may include a conductive material and/or conductive metal nitride. For example, the intermediate barrier layer 410 may include tungsten nitride (WN) and/or tungsten carbonitride (WCN).

A lower metal pattern 451 may be disposed on the intermediate dielectric layer 401. The lower metal pattern 451 may be disposed between the intermediate via 420 and the first via 520. The lower metal pattern 451 may be electrically connected to the intermediate via 420 and the first via 520. The lower metal pattern 451 may include a conductive material, such as aluminum (Al). A lower metal oxide pattern 490 and a lower antireflective pattern 471 may be sequentially formed on the lower metal pattern 451. The lower metal oxide pattern 490 may include conductive metal oxide, such as titanium oxide (TiO2). The lower antireflective pattern 471 may include at least one of the same metal element as that of the lower metal oxide pattern 490. The lower antireflective pattern 471 may include conductive metal nitride, such as titanium nitride (TiN). The lower metal oxide pattern 490 may be in contact/direct contact with a top surface of the lower metal pattern 451, and the lower antireflective pattern 471 may be in contact/direct contact with a top surface of the lower metal oxide pattern 490.

As the lower metal oxide pattern 490 is formed on the lower metal pattern 451, nitrogen (N) may be prevented, or reduced in likelihood, from diffusing into the lower metal pattern 451, and thus the lower metal pattern 451 may have no or minimum or reduced concentration of nitrogen (N). The presence of the lower metal oxide pattern 490 may reduce resistance of semiconductor devices and may reduce or minimize thermal stress generated from an annealing process. Alternatively or additionally, the lower metal oxide pattern 490 may promote diffusion of hydrogen into a semiconductor substrate, and thus transistors may reduce their leakage current and in particular volatile and/or nonvolatile semiconductor devices may improve in refresh characteristics, with the result that semiconductor devices may be provided with improved electrical characteristics.

The second dielectric layer 501 may cover a lateral surface of the lower metal pattern 451, a lateral surface of the lower metal oxide pattern 490, a lateral surface of the lower antireflective pattern 471, and a portion of a top surface of the lower antireflective pattern 471.

A semiconductor device according some example embodiments may be substantially the same as the semiconductor device discussed with reference to FIG. 1, except that they may further include other elements in addition to or alternative to the intermediate dielectric layer 401, the intermediate via 420, the intermediate barrier layer 410, the lower metal pattern 451, the lower metal oxide pattern 490, and the lower antireflective pattern 471.

FIGS. 3 to 12 illustrate cross-sectional views showing a method of fabricating a semiconductor device according to some example embodiments of inventive concepts. The semiconductor device of FIG. 1 will be partially illustrated in the interest of brevity.

Referring to FIG. 1, a transistor 200 may be formed on a substrate 100. A lower dielectric layer 201 may be formed on the substrate 100, covering the transistor 200. On the substrate 100, a lower contact 250 may be formed to penetrate the lower dielectric layer 201 and to have a connection with the substrate 100. On the lower dielectric layer 201, a plurality of first metal patterns 310 may be formed to have connections with the lower contacts 250. A plurality of upper contacts 320 may be formed between and connected to the first metal patterns 310. A first dielectric layer 301 may be formed on the lower dielectric layer 201, covering the first metal patterns 310 and the upper contacts 320.

Figure 3:
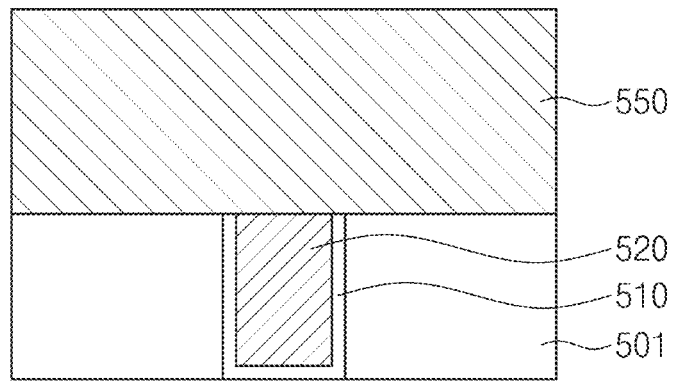
FIGS. 3 to 12 illustrate cross-sectional views showing a method of fabricating a semiconductor device according to some example embodiments of inventive concepts.

Referring to FIGS. 1 and 3, a second dielectric layer 501 may be formed on the first dielectric layer 301, and a first barrier layer 510 and a first via 520 may be formed in the second dielectric layer 501. The formation of the first barrier layer 510 and the first via 520 may include partially removing the second dielectric layer 501 to form a via hole that penetrates the second dielectric layer 501, and locally forming the first barrier layer 510 and the first via 520 in the via hole. The via hole that penetrates the second dielectric layer 501 may be formed by at least one of dry etching, wet etching, laser drilling, or mechanical drilling. The first barrier layer 510 may be formed to fill a portion of the via hole and to have a uniform thickness in the via hole. The first barrier layer 510 may be formed by at least one of a physical vapor deposition (PVD), chemical vapor deposition (CVD), or atomic layer deposition (ALD) process. The first via 520 may be formed to fill a remaining portion of the via hole. The first via 520 may be formed by at least one of a physical vapor deposition (PVD), chemical vapor deposition (CVD), or atomic layer deposition (ALD) process.

A second metal layer 550 may be formed on the second dielectric layer 501. The second metal layer 550 may include a conductive material, such as aluminum (Al). The second metal layer 550 may be formed by at least one of a physical vapor deposition (PVD), chemical vapor deposition (CVD), or atomic layer deposition (ALD) process.

Figure 4:
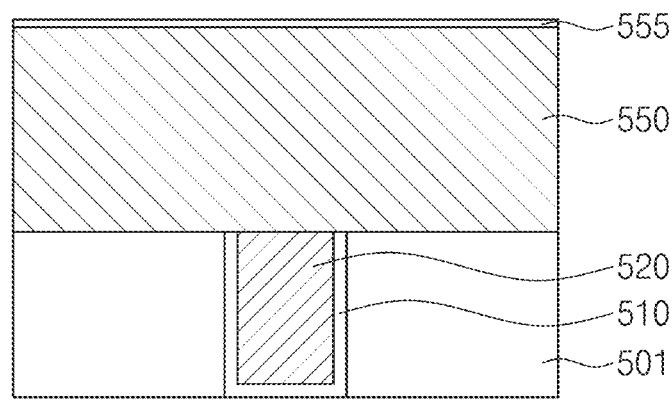

Referring to FIG. 4, a second metal oxide layer 555 may be formed on the second metal layer 550. The second metal oxide layer 555 may be formed to have a uniform thickness. The second metal oxide layer 555 may include conductive metal oxide, for example, aluminum oxide (AlOx). The second metal oxide layer 555 may be formed by at least one of a physical vapor deposition (PVD), chemical vapor deposition (CVD), or atomic layer deposition (ALD) process.

Figure 5:
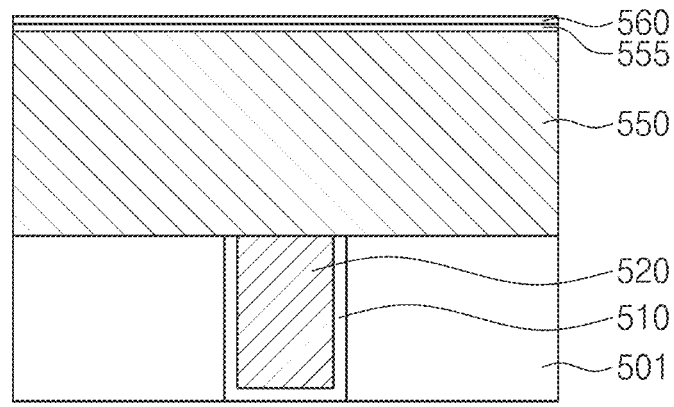

Referring to FIG. 5, a third metal layer 560 may be formed on the second metal oxide layer 555. The third metal layer 560 may be formed to have a uniform thickness. The third metal layer 560 may include a conductive material, such as titanium (Ti). The third metal layer 560 may be formed by at least one of physical vapor deposition (PVD), chemical vapor deposition (CVD), or atomic layer deposition (ALD).

Figure 6:
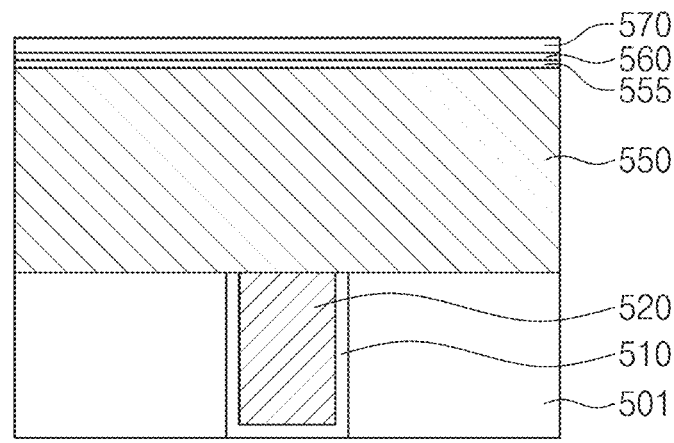

Referring to FIG. 6, an antireflective layer 570 may be formed on the third metal layer 560. The antireflective layer 570 may be formed to have a uniform thickness. The antireflective layer 570 may include the same metal element as that of the third metal layer 560. The antireflective layer 570 may include conductive metal nitride, such as titanium nitride (TiN). The antireflective layer 570 may be formed by at least one of a physical vapor deposition (PVD), chemical vapor deposition (CVD), or atomic layer deposition (ALD) process.

Figure 7:
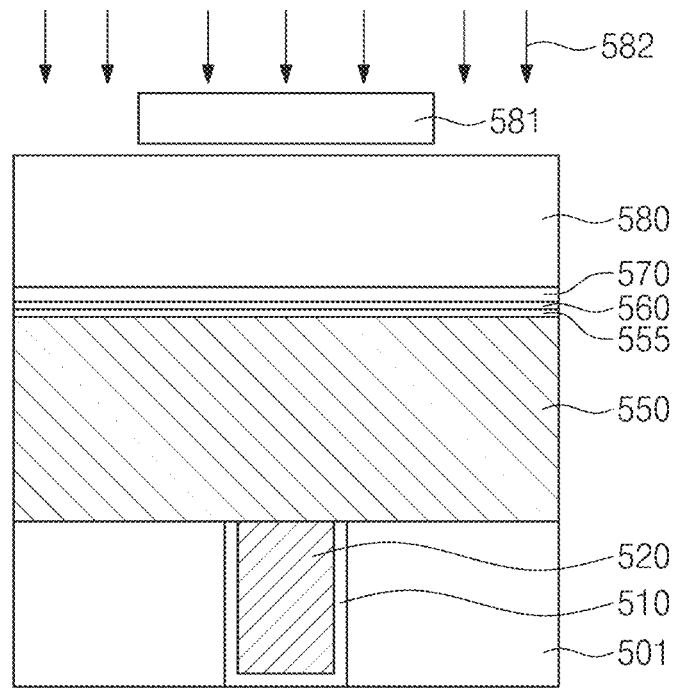
Figure 8:
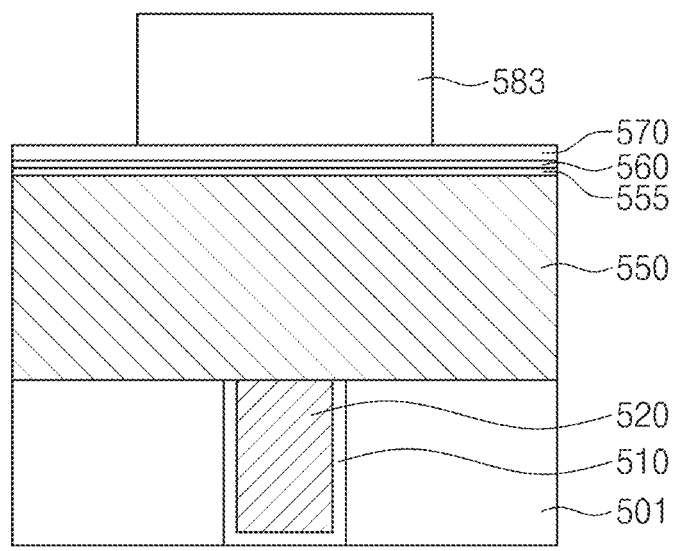

Referring to FIGS. 7 and 8, a photoresist layer 580 may be formed on the antireflective layer 570. The photoresist layer 580 may be irradiated with light 582, such as ultraviolet light, to perform exposure and development processes, and may then be formed into a photoresist pattern 583 to define a region where a pattern will be formed. The photoresist pattern 583 may be used as an etching mask to pattern the second metal layer 550, the second metal oxide layer 555, the third metal layer 560, and the antireflective layer 570. When the light 582 is irradiated, the antireflective layer 570 may protect the second metal layer 550, and/or may help to avoid standing waves within the photoresist layer 580.

Figure 9:
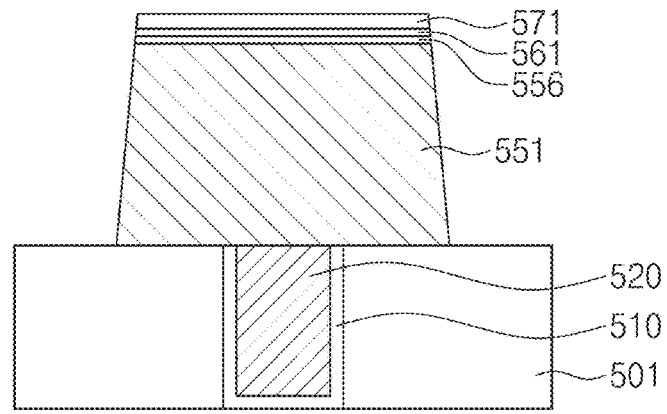

Referring to FIG. 9, an etching process, such as a dry etching process and/or a wet etching process, may be performed in which the second metal layer 550, the second metal oxide layer 555, the third metal layer 560, and the antireflective layer 570 are etched to form a second metal pattern 551, a second metal oxide pattern 556, a third metal pattern 561, and an antireflective pattern 571. After the etching process, the photoresist pattern 583 may be removed by an ashing and/or strip process. The antireflective pattern 571 may include the same metal element as that of the third metal pattern 561. The second metal pattern 551 may include a different material, e.g. a different metal, from that of the third metal pattern 561. The first via 520 may include a different material from that of the second metal pattern 551 and that of the third metal pattern 561.

Figure 10:
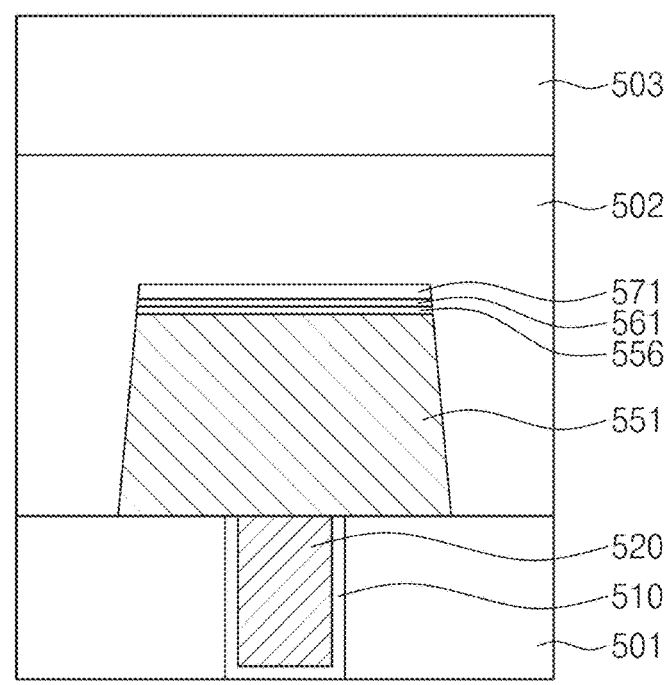

Referring to FIG. 10, a third dielectric layer 502 may be formed on the second dielectric layer 501. The third dielectric layer 502 may cover a lateral surface of the second metal pattern 551, a lateral surface of the second metal oxide pattern 556, a lateral surface of the third metal pattern 561, and lateral and top surfaces of the antireflective pattern 571. A first passivation layer 503 may be formed on the third dielectric layer 502. The first passivation layer 503 may be formed to have a uniform thickness. The third dielectric layer 502 and the first passivation layer 503 may be formed by at least one of a physical vapor deposition (PVD), chemical vapor deposition (CVD), or atomic layer deposition (ALD) process.

Figure 11:
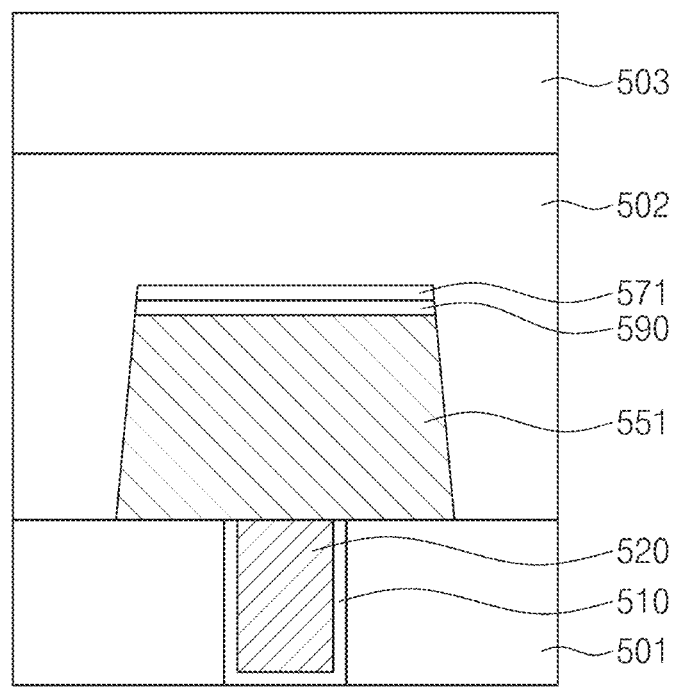

Referring to FIG. 11, an annealing process may be performed in which the second metal oxide pattern 556 and the third metal pattern 561 are reacted with each other to form a metal oxide pattern 590. For example, a metal element (e.g., Ti) of the third metal pattern 561 and an oxygen element of the second metal oxide pattern 556 may react with each other to form the metal oxide pattern 590. The metal oxide pattern 590 may include conductive metal oxide, such as titanium oxide (TiO2). The annealing process may be executed at about 300° C. to about 500° C. and may be performed with a rapid-thermal annealing (RTA) process and/or with a furnace process; however, example embodiments are not limited thereto.

As the metal oxide pattern 590 is formed by the annealing process, nitrogen (N) may be prevented or reduced in likelihood from diffusing into the second metal pattern 551, and thus the second metal pattern 551 may have no or minimum or reduced concentration of nitrogen (N). Accordingly, it may be possible to reduce resistance of semiconductor devices and to reduce or minimize thermal stress generated from the annealing process. Alternatively or additionally, the metal oxide pattern 590 may promote diffusion of hydrogen into a semiconductor substrate, and thus transistors may reduce their leakage current and in particular volatile and non-volatile semiconductor devices may improve in refresh characteristics, with the result that semiconductor devices may be provided with improved electrical characteristics.

Figure 12:
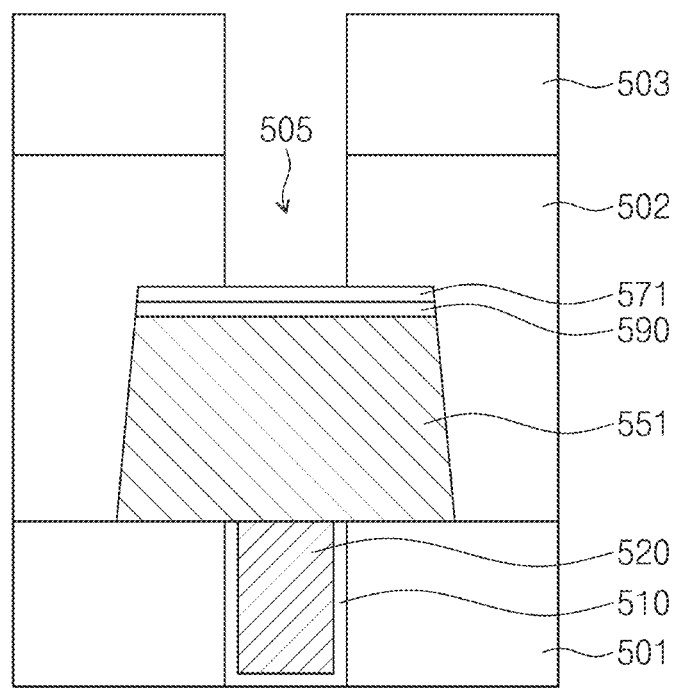

Referring to FIG. 12, the first passivation layer 503, the third dielectric layer 502, and the antireflective pattern 571 may be partially removed to form a second recession 505 that exposes a portion of the antireflective pattern 571.

The method of fabricating a semiconductor device according to some example embodiments of the present inventive concepts may be substantially the same as that discussed with reference to FIG. 1.

A semiconductor device according to some example embodiments of inventive concepts may include a metal oxide layer formed by annealing a metal layer and a metal nitride layer that are sequentially stacked on an aluminum line. Accordingly, it may be possible to reduce resistance of the semiconductor device and to reduce or minimize thermal stress generated from the annealing process. Alternatively or additionally, the metal oxide layer may promote diffusion of hydrogen into a semiconductor substrate, and thus transistors may reduce their leakage current and in particular volatile and non-volatile semiconductor devices may improve in refresh characteristics, with the result that the semiconductor device may be provided with improved electrical characteristics.

Although inventive concepts have been described in connection with the some example embodiments illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A method of fabricating a semiconductor device, the method comprising:
    forming a first dielectric layer on a substrate;
    forming a via in the first dielectric layer;
    sequentially forming a first metal pattern, a first metal oxide pattern, a second metal pattern, and an antireflective pattern on the first dielectric layer; and
    performing an annealing process to react the first metal oxide pattern and the second metal pattern with each other to form a second metal oxide pattern,
    wherein the forming the second metal oxide pattern includes forming the second metal oxide pattern by a reaction between a metal element of the second metal pattern and an oxygen element of the first metal oxide pattern.

2. The method of claim 1, wherein sequentially forming the first metal pattern, the first metal oxide pattern, the second metal pattern, and the antireflective pattern on the first dielectric layer includes:
    forming a first metal layer on the first dielectric layer;
    forming a first metal oxide layer on the first metal layer;
    sequentially forming a second metal layer and an antireflective layer on the first metal oxide layer; and
    etching the first metal layer, the first metal oxide layer, the second metal layer, and the antireflective layer.

3. The method of claim 1, wherein the via includes a material different from a material of the first metal pattern, a material of the second metal pattern, or a material of the first metal pattern and of the second metal pattern.

4. The method of claim 1, wherein the first metal pattern and the second metal pattern include different materials from each other.

5. The method of claim 1, wherein
    the first metal pattern includes aluminum (Al), and
    the second metal pattern includes titanium (Ti).

6. The method of claim 1, wherein
    the antireflective pattern includes conductive metal nitride, and
    the antireflective pattern includes a metal element the same as a metal element of the second metal pattern.

7. The method of claim 1, further comprising:
    before performing the annealing process, forming on the antireflective pattern a second dielectric layer that covers a lateral surface of the first metal pattern, a lateral surface of the first metal oxide pattern, a lateral surface of the second metal pattern, and a lateral surface of the antireflective pattern; and
    forming a passivation layer on the second dielectric layer, the passivation layer covering the second dielectric layer,
    wherein the passivation layer includes a material different from a material of the first dielectric layer and a material of the second dielectric layer.

8. The method of claim 1, wherein forming the via in the first dielectric layer includes:
    removing a portion of the first dielectric layer to form a via hole;
    forming a barrier layer that fills a portion of the via hole; and
    forming the via that fills a remaining portion of the via hole.

9. The method of claim 8, wherein the barrier layer includes a material different from a material of the antireflective pattern.

10. The method of claim 1, wherein the annealing process is performed at about 300° C. to about 500° C.

11. A semiconductor device, comprising:
    a substrate;
    a first metal pattern on the substrate;
    a second metal pattern on the first metal pattern;
    a via between the first metal pattern and the second metal pattern;
    a metal oxide pattern on the second metal pattern; and
    an antireflective pattern on the metal oxide pattern,
    wherein the second metal pattern includes aluminum (Al),
    the metal oxide pattern includes titanium oxide,
    the antireflective pattern includes titanium nitride,
    the via includes a metallic material different from a metallic material of the second metal pattern, and
    the first metal pattern includes a metallic material different from the metallic material of the second metal pattern and the metallic material of the via.

12. The semiconductor device of claim 11, wherein
    the via includes tungsten (W), and
    the first metal pattern includes copper (Cu).

13. The semiconductor device of claim 11, further comprising:
    a first dielectric layer and a second dielectric layer that are sequentially arranged on the substrate;
    a third dielectric layer on the second dielectric layer, the third dielectric layer covering the second metal pattern, the metal oxide pattern, and the antireflective pattern; and
    a passivation layer on the third dielectric layer,
    wherein the first dielectric layer covers the first metal pattern, and
    the via penetrates the second dielectric layer.

14. The semiconductor device of claim 13, further comprising:
a barrier layer between the second dielectric layer and a lateral surface of the via, the barrier layer extending between the first metal pattern and a bottom surface of the via,
wherein the barrier layer includes metal nitride, and
the barrier layer includes a material different from a material of the antireflective pattern.

15. The semiconductor device of claim 11, further comprising:
a lower dielectric layer between the first dielectric layer and the second dielectric layer;
a lower metal pattern on the lower dielectric layer; and
a lower via that penetrates the lower dielectric layer and is connected to the first metal pattern and the lower metal pattern.

16. The semiconductor device of claim 15, further comprising:
a lower metal oxide pattern on the lower metal pattern; and
a lower antireflective pattern on the lower metal oxide pattern.

17. The semiconductor device of claim 16, wherein the lower metal oxide pattern includes a metal element the same as a metal element of the lower antireflective pattern.

18. A semiconductor device, comprising:
a substrate;
a first dielectric layer on the substrate;
a metal pattern on the first dielectric layer;
a metal oxide pattern on the metal pattern;
an antireflective pattern on the metal oxide pattern;
a second dielectric layer on the first dielectric layer, the second dielectric layer covering the metal pattern, the metal oxide pattern, and the antireflective pattern;
a first via that penetrates the first dielectric layer and is connected to the metal pattern; and
a second via that penetrates a portion of the second dielectric layer and is connected to the metal pattern,
wherein the metal pattern includes aluminum (Al),
the metal oxide pattern includes titanium oxide,
the antireflective pattern includes titanium nitride, and
the first via and the second via include a material different from a material of the metal pattern.

19. The semiconductor device of claim 18, further comprising:
a first barrier layer between the first dielectric layer and a lateral surface of the first via, the first barrier layer extending between a bottom surface of the first via and a bottom surface of the first dielectric layer; and
a second barrier layer between the second dielectric layer and a lateral surface of the second via, the second barrier layer extending between the antireflective pattern and a bottom surface of the second via,
wherein the first barrier layer and the second barrier layer include conductive metal nitride, and
the first barrier layer and the second barrier layer include different materials from each other.

20. The semiconductor device of claim 19, wherein the antireflective pattern and the second barrier layer include the same material as each other.

* * * * *